United States Patent [19]

Cakora

[11] 3,895,719

[45] July 22, 1975

[54] SUPPORTING DEVICE FOR PRINTED CIRCUIT BOARDS

[75] Inventor: Dennis Ronald Cakora, Braidwood, Ill.

[73] Assignee: Bunker Ramo Corporation, Oak Brook, Ill.

[22] Filed: Apr. 22, 1974

[21] Appl. No.: 462,639

[52] U.S. Cl. ............................ 317/101 DH; 211/41

[51] Int. Cl. ............................................ H02b 1/02

[58] Field of Search........ 317/101 DH; 211/41, 183, 211/184; 339/17 L, 17 LM, 17 M, 176 MD

[56] References Cited

UNITED STATES PATENTS

| | | | |
|---|---|---|---|
| 2,993,187 | 7/1961 | Bisbing et al. | 211/41 |
| 3,008,113 | 11/1961 | Johnson | 317/101 DH |
| 3,652,899 | 3/1972 | Henschen | 317/101 DH |

*Primary Examiner*—David Smith, Jr.
*Attorney, Agent, or Firm*—William Lohff; F. M. Arbuckle

[57] ABSTRACT

A supporting device is provided for edge support of printed circuit boards interconnected to recessed electrical connectors which are closely arranged in an end-to-end pattern with a space between adjacent ends of adjacent connectors, the supporting device including a pair of spaced apart vertical uprights with outer slots for receiving adjacent edges of adjacent boards with the uprights being joined at their upper end portions and free at their lower end portions to flex together and individually rotate slightly to fit into the space between adjacent connectors in alignment with each connector and for each upright to be mounted on the adjacent connector. The lower end portions of the uprights are chamfered to cause the ends to move together into the space between connectors and a pair of alignment pins are provided on the lower end portion of each upright for alignment between the upright and adjacent connector.

9 Claims, 5 Drawing Figures

SUPPORTING DEVICE FOR PRINTED CIRCUIT BOARDS

BACKGROUND OF THE INVENTION

This invention relates to supporting devices for circuit carrying boards and more particularly to supporting devices for supporting opposite vertical edges of printed circuit boards when electrically interconnected to electrical connectors.

Multi-connector assemblies are commonly utilized with computers and similar equipment to provide a dense contact arrangement achieved by placing a plurality of electrical connectors in a close pattern. In some instances, a box-like frame internally supports the connectors with access being provided through the open top of the frame and the electrical connectors are placed in an end-to-end pattern with a small space separating adjacent connectors. Printed circuit boards are often utilized to provide electrical interconnection with electrical connectors in these multi-connector assemblies. Usually the boards are edge supported in the desired position by devices mounted within the frame. Vertical slots are provided in the devices for guiding the boards into position with respect to each of the connectors and for maintaining the boards in that position.

One of the problems with these assemblies has been the difficulty in installing supporting devices for printed circuit boards in the frames after the connectors have been installed. The connectors may be located at a depth in the frame which is difficult to reach by hand or with ordinary hand-operated fastening tools.

Another problem associated with these assemblies involves the deviation and misalignment between the connectors and the frame and between individual connectors which can occur. When supporting devices are mounted on the frame, the inserted printed circuit board can be misaligned with respect to a connector causing either damage to the board or incomplete electrical interconnection with the connector. Similar results can occur from misalignment between individual adjacent connectors.

SUMMARY

Briefly, the invention is directed to a multi-connector assembly for electrically interconnecting a plurality of circuit carrying boards to a plurality of electrical connectors in which the electrical connectors are supported by a frame and arranged in an end-to-end pattern with adjacent connectors being separated at their ends and the boards are supported by support guides having lower or rearward end portions mountable by hand on the connectors from an upper access opening in the frame. The invention is particularly directed to a support guide for supporting a pair of adjacent edges of adjacent circuit carrying boards and constructed to include support means with a pair of spaced apart vertical uprights joined at their upper extremities and stiffly flexible at their lower extremities for mounting in the space between adjacent connector ends. The vertical uprights include opposite outer sides having vertical slots on the outer sides for receiving the adjacent edges of the adjacent circuit carrying boards. The support means further includes a bridge member on the upper end portions of the uprights for joining the uprights, and alignment means disposed on the lower end portions of the uprights for cooperating with the adjacent connectors to align each upright and slot with respect to the adjacent connector.

Preferably, the support guide is of one piece construction and includes chamfered ends for guiding the lower end portions into the space between adjacent connectors and at least one pair of different sized pins spaced apart to mate with apertures in the adjacent connector for both axial and rotational alignment with the adjacent connector. In addition, the support guide advantageously includes a bridge member shaped to mate with an upper frame support to provide an upper support for the support guide and a tapered side on the uprights to improve heat dissipation from the connectors.

As one of the advantages of the invention, the support guide is adapted for use with existing multi-connector assemblies. Another advantage is that the support guide can be inserted after the connectors have been mounted internally in a box-like frame. Yet another advantage is that the support guide mates with connectors rather than with the frame and is matable with existing connectors.

A further advantage is that the vertical uprights are adjustable to compensate for slight differences in spacing between connectors and do not require exact alignment between connectors and the frame. Still another advantage is that the support guide is rotationally adjustable to compensate for deviations in parallel alignment of adjacent connectors. An additional advantage is that the support guide is adapted for support from frame supports in the upper portions of the frame.

DETAILED DESCRIPTION

Figures 1, 3, 4:
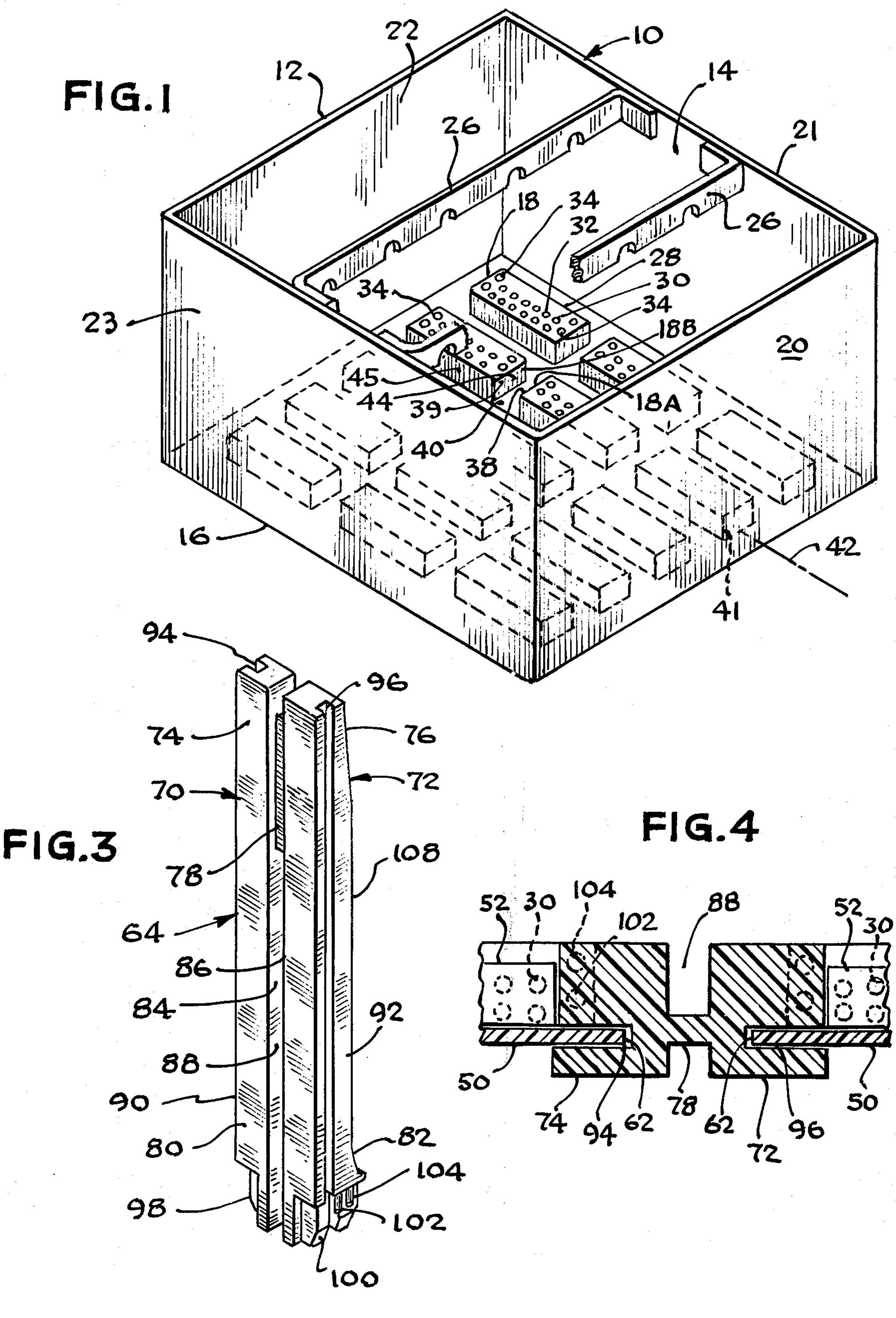
FIG. 1 is a perspective view of a multi-connector assembly before insertion of the supporting device of the invention.
FIG. 3 is a perspective view of a supporting device of FIG. 2.
FIG. 4 is a sectional view taken along line 4–4' of FIG. 2.

Referring to FIG. 1, a multi-connector assembly 10 is illustrated including an outer box-like frame 12 having an open top 14, a bottom support 16 for a plurality of electrical connectors 18 and surrounding sides 20–23. The connectors 18 are disposed internally in frame 12 at a depth which may be in the order of 4–7 inches, and are normally accessible primarily through the open top 14. As also illustrated in FIG. 2, frame 12 further includes an upper brace or frame support 26.

Figures 2, 5:
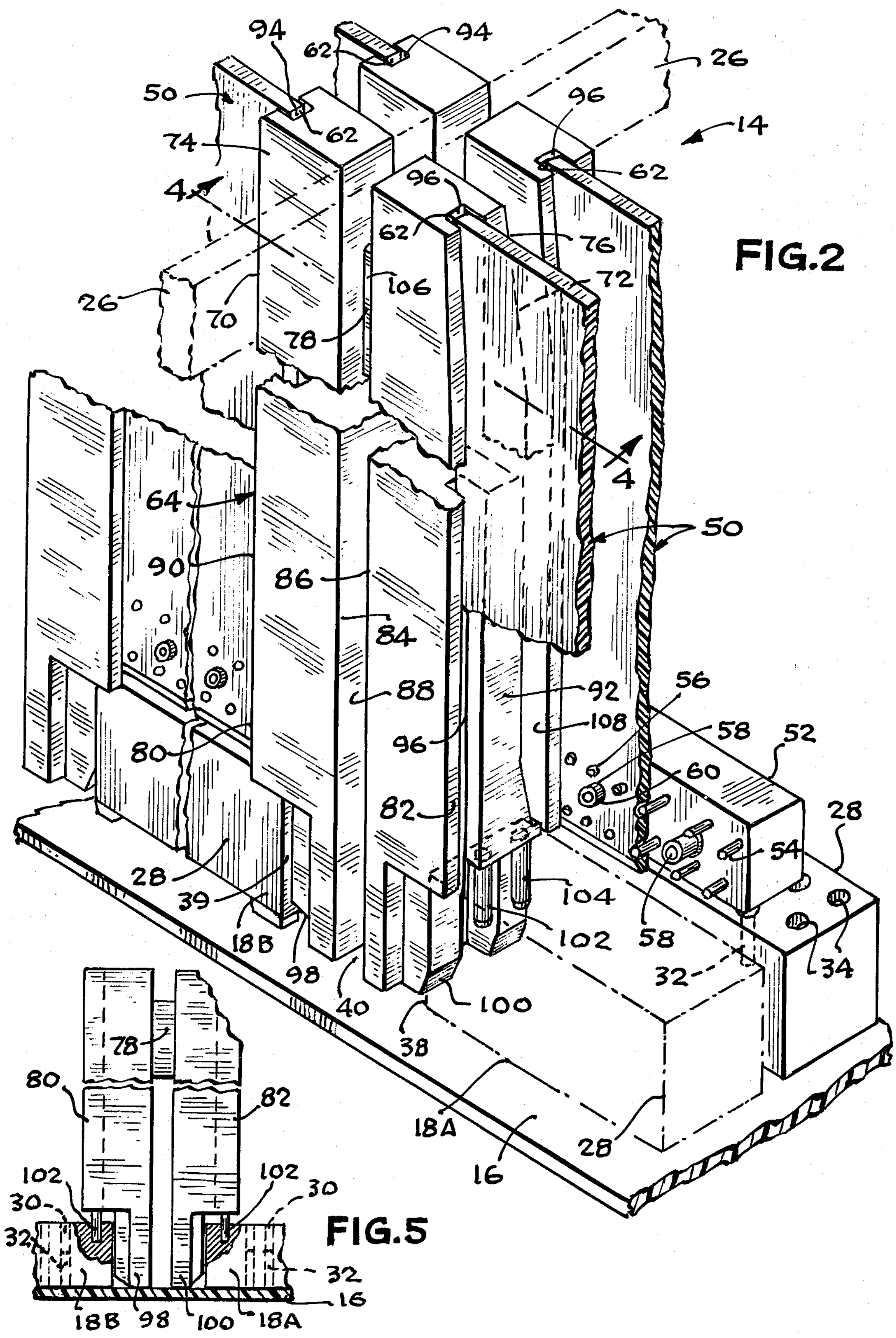
FIG. 2 is an illustration of one embodiment of the invention showing a supporting device mounted between adjacent connectors of FIG. 1.
FIG. 5 is a partial side view of the supporting device with partial cut-away portions.

Each of the connectors 18 in FIGS. 1 and 2 includes a dielectric insert 28 composed of insulating material with contact openings 30 exposing contacts 32 and facing open top 14 of frame 12. Additional apertures 34 are illustrated in FIG. 2 and serve as alignment devices for the supporting device of the invention. The connectors 18 are further illustrated as being arranged in an end-to-end pattern with adjacent connectors 18A and 18B including adjacent ends 38 and 39 separated by space 40. The connectors in each row 41 are aligned with a common axis 42 but in practice often have a slight deviation from that alignment. Sides 44 and 45 further form a part of the general outline of each connector 18. Connector 18 as illustrated is adapted to receive printed circuit board 50 through the use of a header connector 52 with right angle contacts 54 providing electrical engagement between contacts 32 and circuits (not shown) electrically associated with apertures 56 in board 50. Header connector 52 further includes alignment side posts 58 positioned in apertures 60 of board 50 for alignment purposes. Contacts 54 are normally soldered to the circuits associated with apertures 56. Board 50 further includes opposite vertical edges 62 normally supported by an appropriate supporting device.

In accordance with the invention, a supporting device 64 is provided for mounting on the opposite ends 38 and 39 of adjacent connectors 18A and 18B and provides support for edges 62 of adjacent boards 50. The support device 64 includes a pair of spaced apart vertical uprights 70 and 72 with their upper end portions 74 and 76 integrally joined by bridge member 78 and with their lower end portions 80 and 82 flexibly movable axially with respect to connectors 18 and rotationally to fit in space 40 and to be aligned with adjacent connectors 18A and 18B. Vertical uprights 70 and 72 further include adjoining inner sides 84 and 86 separated by groove 88 and the outer sides 90 and 92 with vertical slots 94 and 96 to guide the entry of board 50 into electrical engagement with connector 18 and for subsequent support of board 50.

As illustrated in FIGS. 2, 3 and 5, the lower end portions 80 and 82 include chamfered lower ends 98 and of the for positioning the vertical uprights in space 40. Outwardly and laterally disposed from each 52 interconnected chamfered lower ends on each vertical upright are a pair of spaced apart pins 102 and 104 preferably of different lengths and sizes and spaced for insertion in alignment apertures 34 in connector 18. In FIG. 2, bridge member 78 is further illustrated as a relatively thin flat member which can be inserted into slots 106 in frame support 26.

Bridge member 78 as illustrated in FIG. 4 is formed as a thin member to permit the slight rotational movement in each ofthe uprights 70 and 72 for alignment in connectors 18A and 18B. With header connector 72 interconnectored to board 50, the flexibility in alignment is beneficial since the lower ends of contacts 54 must be aligned with apertures 30 before connector 52 can be mated with connector 18A. The alignment further permits board 50 to easily fit into slot 94 for guiding into its final position.

The inventive card support is relatively easy to mount in the multi-connector assembly 10. The outer sides 90 and 92 of vertical uprights 70 and 72 may be gripped manually and squeezed to move lower portions 80 and 82 slightly together after which the lower end portions 80 and 82 are inserted between adjacent ends 38 and 39 of adjacent connectors 18A and 18B. Initial alignment between each upright and adjacent connector is achieved by engagement of the longer pin 102 with aperture 34 after which the smaller pin 104 engages another aperture 34. Misalignment of adjacent connectors 18A and 18B from axis 42 is compensated by a slight rotational movement on one or both of the vertical uprights 70 and 72 to achieve engagement of both pins 102 and 104 in apertures 34.

Preferably, the support guide is of a molded one piece construction and formed of an insulating material such as nylon or other resilient plastic. In addition, the vertical uprights 70 and 72 are tapered at sides 108 to increase the spacing between laterally adjacent support guides and printed circuit boards to improve heat dissipation from the connectors.

I claim:

1. In a multi-connector assembly for electrically interconnecting a plurality of circuit carrying boards to a plurality of electrical connectors and including an open-top frame internally supporting said electrical connectors, said connectors facing said open top and arranged in an end-to-end pattern with a space between adjacent ends of adjacent connectors, a support guide for supporting adjacent edges of said boards when interconnected to said adjacent connectors and including support means insertable in said space between said adjacent connector ends and including a pair of spaced apart vertical uprights with upper and lower end portions and opposite outer sides, each of said outer sides including means for receiving one of said edges of each of said boards, a bridge member on the upper end portions of said uprights joining said uprights, and alignment means disposed on each of the lower end portions of said uprights for cooperating with the adjacent connector to align each upright and said receiving means with respect to said adjacent connector.

2. The multi-connector assembly of claim 1 wherein said lower end portions of said vertical uprights are capable of being flexed inwardly and individually rotationally to fit into said space between said adjacent connectors and to compensate for slight deviations in alignment of said adjacent connectors.

3. The multi-connector assembly of claim 2 wherein said lower end portions include chamfered ends for guiding said ends into said space.

4. The multi-connector assembly of claim 2 wherein said alignment means includes at least two pins disposed in spaced apart relation on each of said lower end portions to rotationally align each vertical upright with said adjacent connector.

5. The multi-connector assembly of claim 4 wherein said pins are of different sizes for orientation between each of said vertical uprights and said adjacent connector.

6. The multi-connector assembly of claim 2 wherein said frame includes at least one upper frame support in juxtaposition with said open end and said bridge members shaped to mate with said frame support to provide an upper support for said support guide.

7. The multi-connector assembly of claim 2 wherein said vertical uprights each include a second side tapered inwardly in an upward direction to improve the dissipation of heat from said connectors.

8. A supporting device for engagement with edges of circuit carrying boards for support of said boards when interconnected with electrical connectors arranged in an end-to-end pattern with a space between adjacent ends of adjacent connectors, comprising support means insertable in said space between said adjacent connector ends and including a pair of spaced apart vertical uprights with upper and lower end portions and opposite outer sides, each of said outer sides including guide means for receiving one of said edges of each of said boards, a bridge member on the upper end portions of said uprights joining said uprights, and alignment means disposed on each of the lower end portions of said uprights for cooperating with the adjacent connector to align each upright and said guide means with respect to said adjacent connector.

9. The supporting device of claim 8 wherein said guide means includes a vertical slot.

* * * * *

UNITED STATES PATENT OFFICE
CERTIFICATE OF CORRECTION

PATENT NO. : 3,895,719

DATED : July 22, 1975

INVENTOR(S) : Dennis Ronald Cakora

It is certified that error appears in the above-identified patent and that said Letters Patent are hereby corrected as shown below:

Column 3, line 33, cancel "of the"; same line before "for" insert -100-; line 34 cancel "52 inter-"; line 35, cancel "connected"; same line, before "chamfered" insert -of the-; line 44, change "ofthe" to -of the-; line 45, change "72" to -52-.

Signed and Sealed this

*twenty-seventh* Day of *January 1976*

[SEAL]

*Attest:*

RUTH C. MASON
*Attesting Officer*

C. MARSHALL DANN
*Commissioner of Patents and Trademarks*